US010121761B2

(12) United States Patent
Watanabe

(10) Patent No.: US 10,121,761 B2
(45) Date of Patent: Nov. 6, 2018

(54) HETERO-BIPOLAR TRANSISTOR AND METHOD FOR PRODUCING THE SAME

(71) Applicant: SUMITOMO ELECTRIC INDUSTRIES, LTD., Osaka (JP)

(72) Inventor: Masataka Watanabe, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 1 day.

(21) Appl. No.: 15/589,614

(22) Filed: May 8, 2017

(65) Prior Publication Data

US 2017/0271300 A1   Sep. 21, 2017

Related U.S. Application Data

(62) Division of application No. 14/944,358, filed on Nov. 18, 2015.

(30) Foreign Application Priority Data

Nov. 18, 2014   (JP) ................................. 2014-233583
Nov. 13, 2015   (JP) ................................. 2015-222943

(51) Int. Cl.
  *H01L 29/66*   (2006.01)
  *H01L 23/00*   (2006.01)
  (Continued)

(52) U.S. Cl.
  CPC ........ *H01L 24/83* (2013.01); *H01L 21/30612* (2013.01); *H01L 21/6835* (2013.01);
  (Continued)

(58) Field of Classification Search
  CPC ......... H01L 21/6835; H01L 2221/6835; H01L 2221/68368; H01L 29/66242; H01L 29/41708; H01L 29/66318
  See application file for complete search history.

(56) References Cited

U.S. PATENT DOCUMENTS 4,292,730 A * 10/1981 Ports ..................... H01L 21/743
                                                    148/DIG. 136
6,562,648 B1 * 5/2003 Wong .................. H01L 21/2007
                                                    257/E21.122

(Continued)

FOREIGN PATENT DOCUMENTS

JP        5-36713        12/1993

*Primary Examiner* — Frederick B Hargrove
(74) *Attorney, Agent, or Firm* — Smith, Gambrell & Russell, LLP

(57) ABSTRACT

A method of producing a semiconductor device includes steps of: growing semiconductor layers to form a semiconductor stack on a semiconductor substrate; forming a first adhesive layer on the semiconductor stack; bonding a temporary support made of non-semiconductor material to the first adhesive layer; removing the semiconductor substrate from the semiconductor stack to expose a surface of the semiconductor stack; forming a second adhesive layer on the exposed surface of the semiconductor stack; bonding a support to the second adhesive layer; and removing the temporary support from the semiconductor stack. The support has a thermal conductivity greater than the thermal conductivities of the semiconductor layer in the semiconductor stack. In forming the first adhesive layer, this layer can cover the entire surface, or both the top and a side of the semiconductor stack. Before forming the first adhesive layer, a protective layer can be formed on the semiconductor stack.

20 Claims, 17 Drawing Sheets

(51) Int. Cl.
    *H01L 29/737*     (2006.01)
    *H01L 21/306*     (2006.01)
    *H01L 21/683*     (2006.01)
    *H01L 29/417*     (2006.01)
    *H01L 29/423*     (2006.01)
    *H01L 29/06*     (2006.01)
    *H01L 23/367*     (2006.01)

(52) U.S. Cl.
    CPC .......... *H01L 24/27* (2013.01); *H01L 29/0692* (2013.01); *H01L 29/41708* (2013.01); *H01L 29/42304* (2013.01); *H01L 29/66242* (2013.01); *H01L 29/66318* (2013.01); *H01L 29/7371* (2013.01); *H01L 23/367* (2013.01); *H01L 2221/6835* (2013.01); *H01L 2221/68368* (2013.01); *H01L 2221/68381* (2013.01); *H01L 2224/2745* (2013.01); *H01L 2224/83851* (2013.01)

(56) References Cited

U.S. PATENT DOCUMENTS

| | | | |
|---|---|---|---|
| 8,860,092 B1* | 10/2014 | Li | H01L 29/66242 257/197 |
| 2004/0048447 A1* | 3/2004 | Kondo | H01L 21/30612 438/458 |
| 2004/0164409 A1 | 8/2004 | Schammler et al. | |
| 2005/0151159 A1 | 7/2005 | Ma et al. | |
| 2010/0039482 A1 | 2/2010 | Fujii et al. | |
| 2013/0099267 A1 | 4/2013 | Moser et al. | |
| 2014/0042447 A1* | 2/2014 | Nie | H01L 21/6835 257/76 |

\* cited by examiner

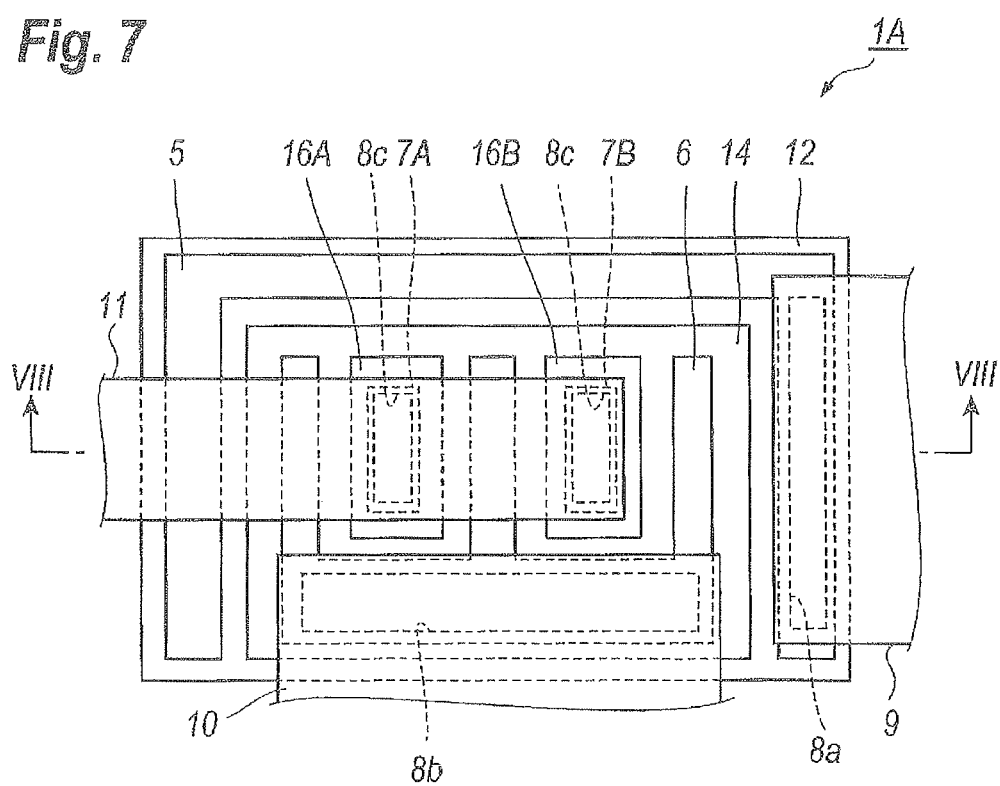

HETERO-BIPOLAR TRANSISTOR AND METHOD FOR PRODUCING THE SAME

BACKGROUND

1. Field of the Invention

The present application relates to a hetero-bipolar transistor and a method for producing the hetero-bipolar transistor.

2. Background Arts

As a communication apparatus becomes operable in higher frequencies, a semiconductor device applicable to such high frequencies has been continuously requested in the field. One promising device is, what is called, a heterojunction bipolar transistor (hereafter denoted as HBT). Many prior arts have reported an HBT that stacks, on a semi-insulating GaAs substrate, an n-type GaAs collector, a p-type GaAs base, an emitter constituted by an n-type InGaP and an n-type AlGaAs.

Not only an HBT above described but a semiconductor device generates heat because of a current flowing therein. This self-heating of the semiconductor device sometimes causes thermal runaway. In another aspect, when a temperature of the device rises by the self-heating, the performance and the life time of the device inevitably degrade. Means to dissipate heat efficiently outward of the device are continuously requested. The present application provides solutions to improve the thermal characteristics of the semiconductor device.

SUMMARY

An aspect of the present application relates to a semiconductor device that comprises a metal layer provided on a support, a semiconductor stack provided on the metal layer, and electrodes provided on the semiconductor stack. A feature of the semiconductor device of one embodiment of the present application is that the metal layer is made of one of tungsten (W), molybdenum (Mo), and tantalum (Ta) with a thickness of 10 to 60 nm. The support preferably has thermal conductivity greater than those of semiconductor layers constituting the semiconductor stack; that is, the support has the thermal conductivity of 100 to 3000 W/m/K, or is made of at least one of aluminum nitride (AlN), silicon (Si), silicon carbide (SiC), and diamond (C), and a thickness of 20 to 200 μm.

Another aspect of the present application relates to a method to produce a semiconductor device. The method includes steps of: (a) growing a semiconductor layers to form a semiconductor stack on a semiconductor substrate; (b) forming a first adhesive layer on the semiconductor stack; (c) bonding a temporary support made of non-semiconductor material to the first adhesive layer; (c) removing the semiconductor substrate from the semiconductor stack, which exposes a surface of the semiconductor stack; (d) forming a second adhesive layer on the exposed surface of the semiconductor stack; (e) bonding a support to the second adhesive layer; and (f) removing the temporary support from the semiconductor stack. A feature of the process of the embodiment is that the support has thermal conductivity greater than thermal conductivities of the semiconductor layers constituting the semiconductor stack.

BRIEF DESCRIPTION OF DRAWINGS

The foregoing and other purposes, aspects and advantages will be better understood from the following detailed description of a preferred embodiment of the invention with reference to the drawings, in which:

FIG. 7 is a plan view of a semiconductor device modified from that shown in FIG. 1;

FIG. 8 is taken along the line VIII-VIII appearing in FIG. 7;

FIG. 10 is taken along the line X-X indicated in FIG. 9;

DESCRIPTION OF EMBODIMENTS

Next, some embodiments of the present application will be described as referring to accompanying drawings. In the description of the drawings, numerals or symbols same with or similar to each other will refer to elements same with or similar to each other without duplicating explanations.

First Embodiment

Figure 1:
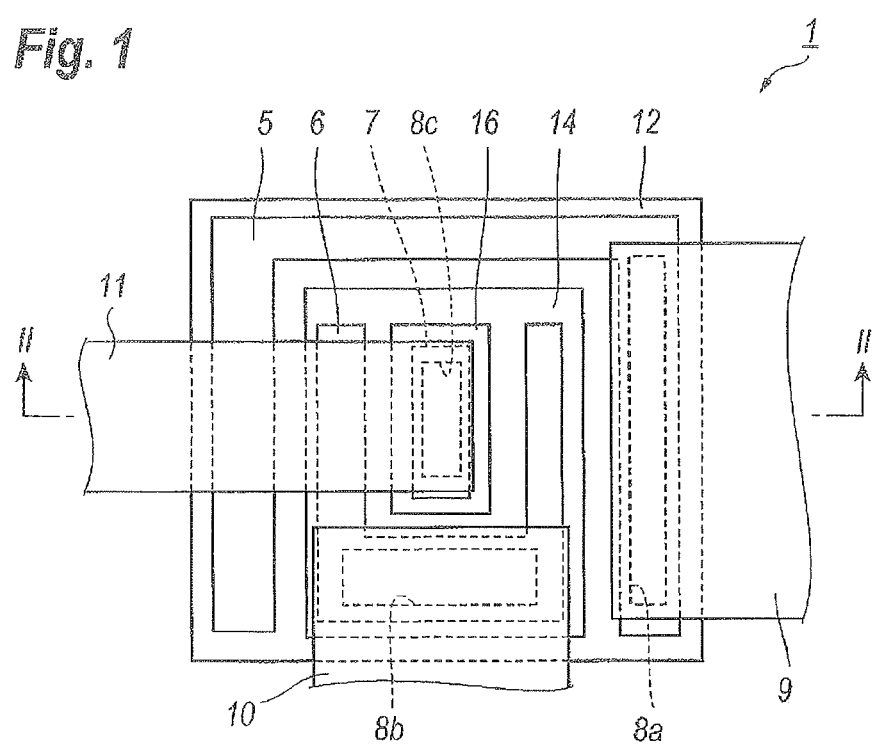
FIG. 1 is a plan view of a semiconductor device according to the first embodiment of the present application.
Figure 2:
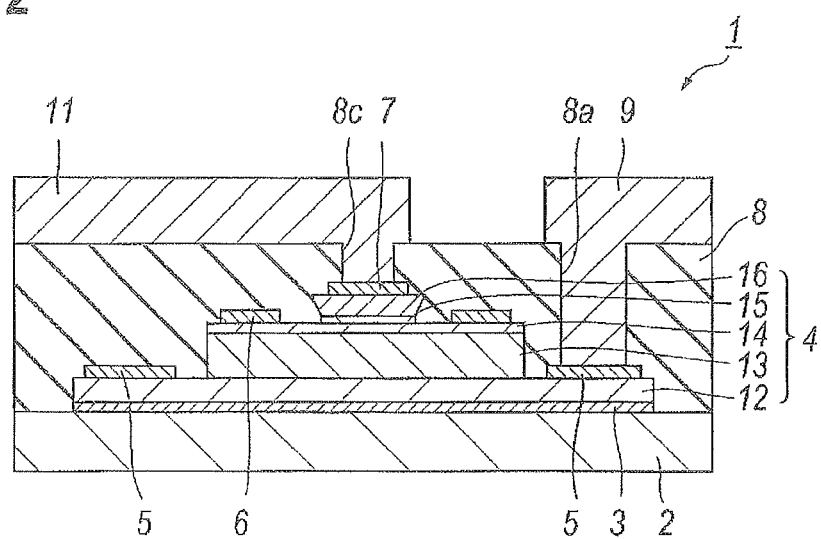
FIG. 2 shows a cross section of the semiconductor device taken along the line II-II indicated in FIG. 1.

FIG. 1 is a plan view of a semiconductor device according to the first embodiment of the present application; and FIG. 2 shows a cross section taken along the line II-II indicated in FIG. 1. The semiconductor device 1 of the embodiment is a type of the hetero-bipolar transistor (HBT) formed on a support 2. The HBT 1 includes a metal layer 3 on the support 2, a semiconductor stack 4 on the metal layer 3, electrodes, 5 to 7, on the semiconductor stack 4, an insulating layer 8 embedding the semiconductor stack 4 and the electrodes, 5 to 7, and interconnections, 9 to 11.

The support 2, which has thermal conductivity greater than those of the semiconductor material involved in the HBT 1, is preferable made of, for instance, aluminum nitride (AlN), silicon (Si), silicon carbide (SiC), and/or diamond. The support 2 may have a thickness of 20 to 200 μm and the thermal conductivity higher than that of indium phosphide (InP). The support 2 of the present embodiment has the thermal conductivity greater than 100 but less than 3000 (W/m/K). On the other hand, the semiconductor materials involved in the HBT 1, which are InP and InGaAs in the present embodiment, have thermal conductivity less than 100 W/m/K.

The metal layer 3, which is put between the support 2 and the semiconductor stack 4, may be made of material containing at least one of tungsten (W), molybdenum (Mo), and tantalum (Ta), or an alloy containing those metals. The metal layer 3 may have a thickness of 10 to 60 nm. The metal layer 3 with a thickness greater than 10 nm may effectively prevent the semiconductor stack 4 from being detached from the support 2, and the metal layer 3 with a thickness less than 60 nm may effectively conduct heat generated in the semiconductor stack 4 to the support 2. The thickness of the metal layer 3 may be less than 50 nm, less than 45 nm, or less than 40 nm.

The semiconductor stack 4, which may include semiconductor layers made of group III-V compound semiconductor materials, includes a sub-collector layer 12 on the metal layer 3, a collector layer 13 on the sub-collector layer 12, a base layer 14 on the collector layer 13, an emitter layer 15 on the base layer 14, and an emitter contact layer 16 on the emitter layer 15.

The sub-collector layer 12 on the metal layer 3 may be made of n-type InP with a thickness of about 300 nm. The sub-collector layer 12 may be doped with silicon (Si) by concentration of $2\times10^{19}/cm^3$. The collector layer 13, which is formed on a portion of the sub-collector layer 12, may include a stack of n-type InAlGaAs with a thickness of 50 nm and n-type InP with a thickness of 200 nm. The n-type InAlGaAs has the Si concentration of about $1\times10^{17}/cm^3$, while, the n-type InP has the Si concentration of about $3\times10^{16}/cm^3$.

The base layer 14 on the collector layer 13, which may be made of a p-type InGaAs with a thickness of 400 nm and have the carbon (C) concentration of $5\times10^{19}/cm^3$. The emitter layer 15, which is formed on a portion of the base layer 14, may be made of n-type InP with a thickness of 150 nm and have the Si concentration of $2\times10^{18}/cm^3$. The emitter contact layer 16, which is formed on the emitter layer 15, may be made of n-type InGaAs with a thickness of 250 nm and have the Si concentration of $2\times10^{19}/cm^3$.

The electrode 5 is a collector electrode of the HBT 1 in contact with a portion of the sub-collector layer 12. The electrode 6 is a base electrode of the HBT 1 in contact with a portion of the base layer 12. The electrode 7 is an emitter electrode of the HBT 1 in contact with a portion of the emitter contact layer 16. The electrodes, 5 to 7, may be made of platinum (Pt) with a thickness of 10 nm, titanium (Ti) with a thickness of 30 nm, platinum (Pt) with a thickness of 30 nm, and gold (Au) with a thickness of 100 nm stacked in this order from corresponding semiconductor layers.

The insulating layer 8, which covers the semiconductor stack 4, may include a stack including a silicon oxy-nitride (SiON) and a silicon nitride (SiN), but may include silicon oxide (SiO) and/or some organic materials such as polyimide. The insulating layer 8 provides openings, 8a to 8c. The interconnection 9 is in contact with the electrode 5, namely, the collector electrode of the HBT 1, in the opening 8a of the insulating layer 8. The interconnection 10 is in contact with the electrode 6, namely, the base electrode of the HBT 1, in the opening 8b of the insulating layer 8. The interconnection 11 is in contact with the electrode 7, namely, the emitter electrode of the HBT 1, in the opening 8c of the insulating layer 8. The interconnections, 9 to 11, may be made of titanium (Ti) with a thickness of 30 nm, platinum (Pt) with a thickness of 50 nm, and gold (Au) with a thickness of 500 nm.

Next, a process of forming the semiconductor device 1 will be described as referring to FIGS. 3 to 6, where FIGS. 3A to 4C show cross sections of a whole wafer, while, FIGS. 5A to 6C show cross sections of a portion of the wafer corresponding to one semiconductor device.

The process first prepares a semiconductor substrate 21 that stacks a protection layer 22, a semiconductor stack 23, another protection layer 24, and a metal layer 25 as an adhesive material (layer) in this order on the semiconductor substrate 21; and a temporary support 26 that provides a metal layer 27 thereon also as an adhesive material. The first step grows the protection layer 22 and the semiconductor stack 23. The first step further grows the other protection layer 24 on a primary surface 23a of the semiconductor stack 23, and forms the metal layer 25 covering those grown semiconductor layers. The semiconductor substrate 21 may be made of material grouped in the III-V compound semiconductor. The semiconductor substrate 21 of the present embodiment is made of InP. The protection layer 22 may be made of material harder to be etched compared with the semiconductor substrate 21. In the present embodiment, the protection layer 22 is made of epitaxially grown InGaAs with a thickness of 200 nm.

The semiconductor stack 23 includes semiconductor layers, 31 to 35, which correspond to the sub-collector layer 12, the collector layer 13, the base layer 14, the emitter layer 15, and the emitter contact layer 16, respectively, where all of them are shown in FIG. 2 and epitaxially grown on the protection layer 22.

The other protection layer 24 may be made of material harder to be etched compared with the semiconductor stack 23. The present embodiment provides the other protection layer 24 made of epitaxially grown InP with a thickness of 200 nm. The metal layers, 25 and 27, may be made of tungsten (W) formed by sputtering. When the metal layer 25 is formed in a thickness greater than 5 nm, a metal layer, which is a portion of the metal layer 25, is also formed in peripheries (edge) or side surface of the semiconductor stack 23. The metal layer 25 left in the side surface of the semiconductor stack 23 may effectively protect the semiconductor stack 23 during a process to remove the semiconductor substrate 21 from the semiconductor stack 23.

Figure 3A:
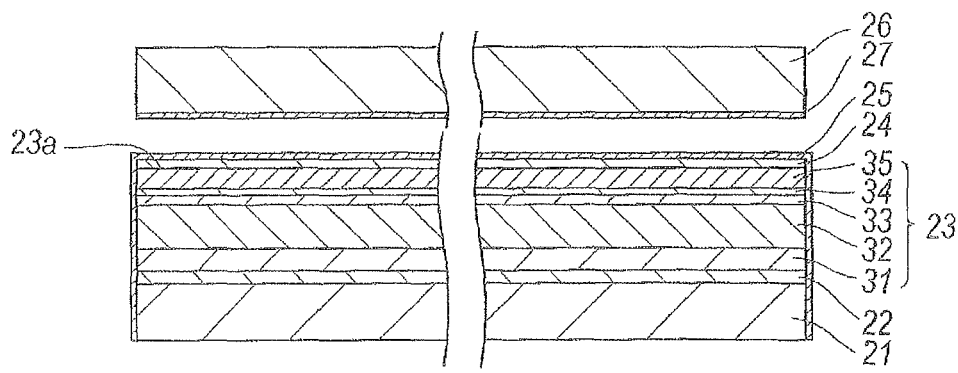
FIGS. 3A to 3C show cross sections of the whole of semiconductor wafer at respective process steps.
Figure 3B:
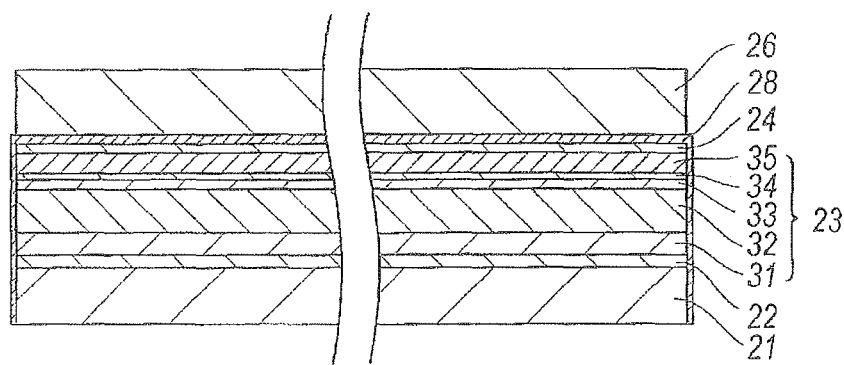

Then, as illustrated in FIG. 3B, the second step bonds the temporary support 26 on the metal layer 25. The temporary support 26 may be made of non-semiconductor material, typically, aluminum nitride (AlN) and/or silica glass ($SiO_2$). Specifically, the metal layer 27 provided on the temporary support 26 as an adhesive material is bonded to the metal layer 25 as another adhesive material on the other protection layer 24, which forms a composite metal layer 28 between the other protection layer 24 and the temporary support 26. The bonding of the metal layers, 25 and 27, may be carried out by the atomic diffusion bonding (ADB). The ADB has been known as a technique to bond materials without any adhesive by depositing materials on respective substances to be bonded and making closely in contact with each other without exposing the materials in an atmosphere. The ADB may accompany with heating two materials and pressing to each other to assist and secure the bonding.

Figure 3C:
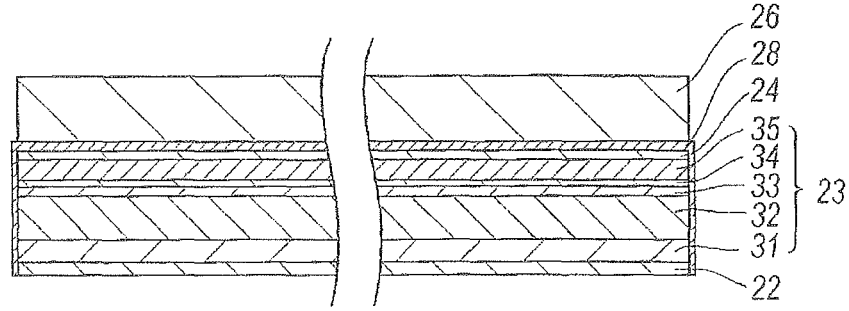

Then, as shown in FIG. 3C, the third step removes the semiconductor substrate 21 from the semiconductor stack 23 by, for instance, dry-etching and/or wet-etching. In this step, the protection layer 22 put between the semiconductor substrate 21 and the semiconductor stack 23 may protect the semiconductor stack 23 from being etched because the protection layer 22 has an etching rate far less than that of the semiconductor substrate 21. Also, the metal layer 25 formed in the side surface of the semiconductor stack 23 may prevent the semiconductor stack 23 from being etched.

Figure 4A:
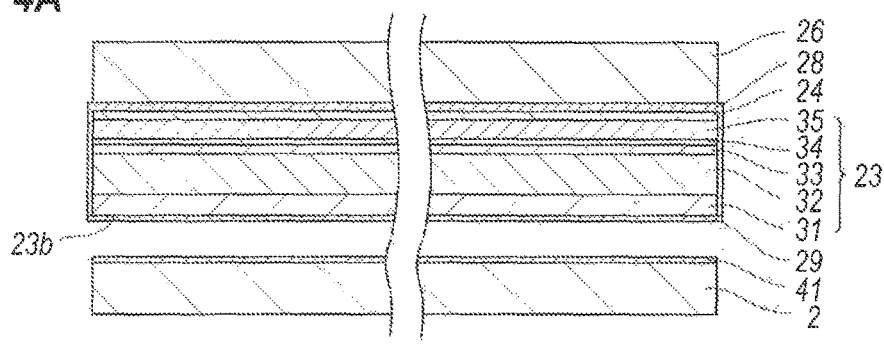
FIGS. 4A to 4C show cross sections of the whole of the support at respective process steps subsequent to that shown in FIG. 3C.

Then, as illustrated in FIG. 4A, the fourth step forms another metal layer 29 as an adhesive material on an exposed surface 23b of the semiconductor stack 23 by the removal of the semiconductor substrate 21 and the protection layer 22. The fourth step further prepares a support 2 that provides a metal layer 41 thereon as another adhesive material. The metal layer 41 on the support 2 may be made of tungsten (W). The support 2 has thermal conductivity greater than that of the semiconductor substrate 21 removed in this step.

Figure 4B:
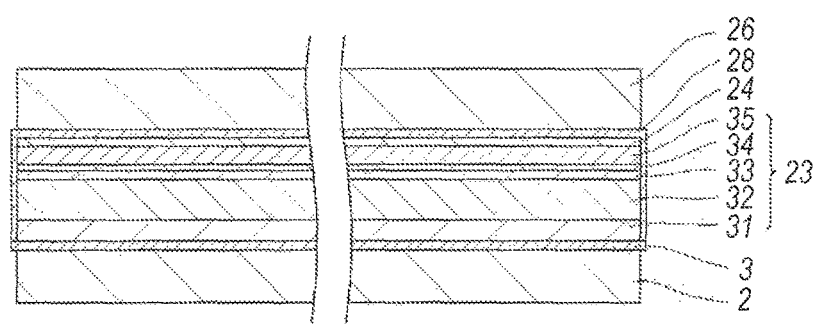

Next, the fifth step bonds the support 2 on the metal layer 29 by the ADB, as shown in FIG. 4B. The ADB that bonds the metal layer 41 on the support 2 with the metal layer 29 in the exposed surface 23b of the semiconductor stack 23 may form a metal layer 3 between the support 2 and the semiconductor stack 23.

Figure 4C:
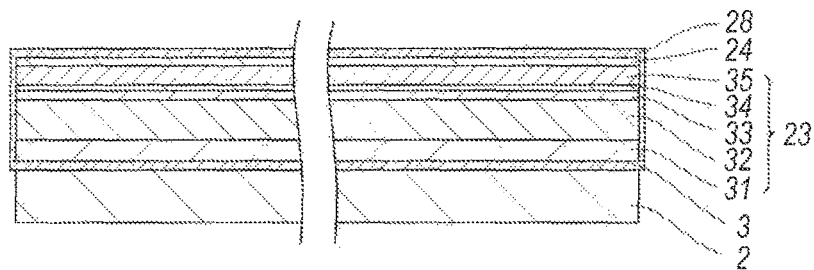

Next, the sixth step removes the temporary support 26 from the semiconductor stack 23 by dry-etching and/or wet-etching, as shown in FIG. 4C. The metal layer 28 may prevent the semiconductor stack 23 from being etched during the removal of the temporary support 26. Thus, the metal layer 28 shows a function of the etch-stopping layer.

Figure 5A:
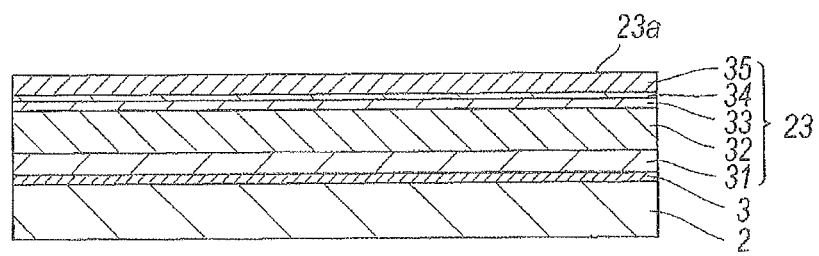
FIG. 5A shows a cross section of a part of the support at the process step subsequent to that shown in FIG. 4C, and FIGS. 5B and 5C show cross section of the semiconductor device at respective process steps subsequent to that shown in FIG. 5A.

Next, as shown in FIG. 5A, the seventh step sequentially removes the metal layer 28 left on the semiconductor stack 23 and the protection layer 24. The protection layer 24 may show a function of the etch-stopping layer for the removal of the metal layer 28 and protect the semiconductor stack 23 from being etched. The metal layer 28 left in the side surface of the semiconductor stack 23 may be also removed in this step. After the removal of the metal layer 28, the protection layer 24 left on the primary surface 23a of the semiconductor stack 23 is also removed. The figure shown in FIG. 5A is an enlarged figure of the device forming region shown in FIG. 4C. Figures shown in FIGS. 5B to 6C are also.

Figure 5B:
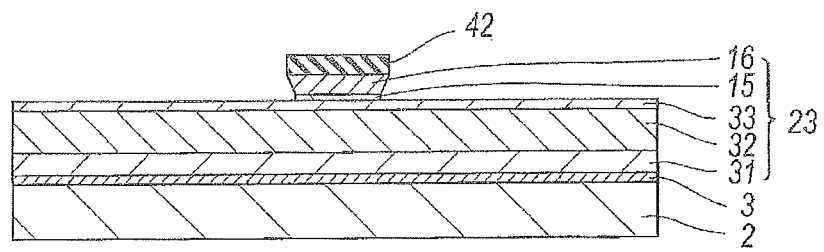

Next, the eighth step partially wet-etches the semiconductor layers, 34 and 35, in the semiconductor stack 23 by forming an etching mask 42 made of silicon nitride (SiN) and/or silicon oxide (SiOx) on the primary surface 23a of the semiconductor stack 23, as shown in FIG. 5B. This etching forms the emitter layer 15 and the emitter contact layer 16.

Figure 5C:
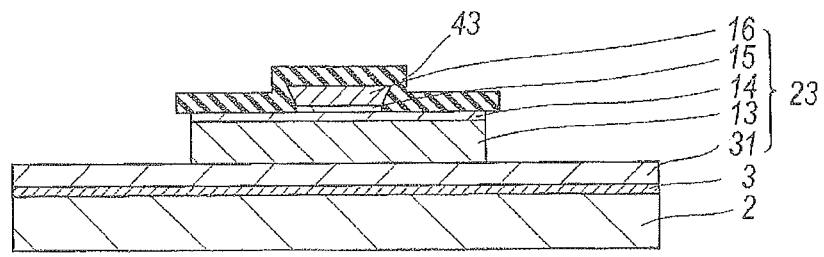

Next, as shown in FIG. 5C, the ninth step forms an etching mask 43 that covers the emitter layer 15, the emitter contact layer 16, and a portion of the semiconductor stack 23 after removing the aforementioned etching mask 42. Then, a portion of the semiconductor layers, 32 and 33, in the semiconductor stack 23 are sequentially removed by the wet-etching. This etching forms the collector layer 13 and the base layer 14. Thus, the ninth step may form a mesa primarily showing the function of a bipolar transistor 1 containing the collector layer 13, the base layer 14, the emitter layer 15, and the emitter contact layer 16.

Figure 6A:
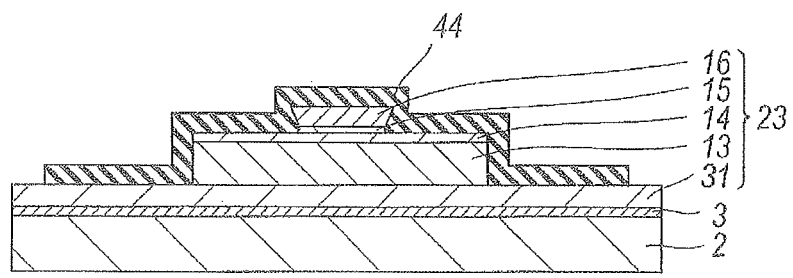
FIGS. 6A to 6C show cross sections of the semiconductor device at respective process steps subsequent to that shown in FIG. 5C.

Next, the tenth step removes the aforementioned etching mask 43 and forms again another etching mask 44 as shown in FIG. 6A, where the etching mask 44 covers a portion of the lowermost semiconductor layer 31, the collector layer 13, the base layer 14, the emitter layer 15, and the emitter contact layer 16.

Figure 6B:
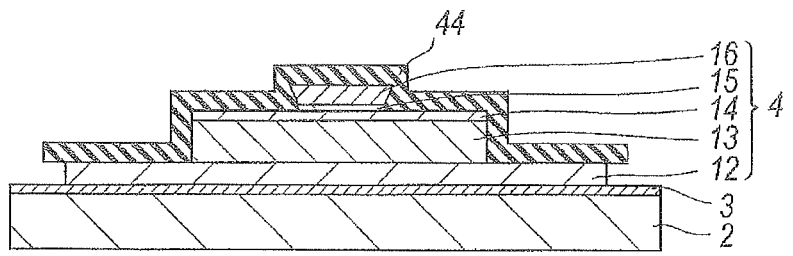

Next, the eleventh step wet-etches the portion of the semiconductor lowermost layer 31 using thus formed etching mask 44, which forms the sub-collector layer 12, as shown in FIG. 6B. Thus, the semiconductor stack 4 that includes the primary portion of the bipolar transistor 1 comprised of a mesa including the sub-collector layer 12, the collector layer 13, the base layer 14, the emitter layer 15, and the emitter contact layer 16. After forming a collector mesa including the sub-collector layer 12 as shown in FIG. 6B, using the etching mask 44, the metal layer 3 not sandwiched between the support 2 and the semiconductor stack 4 is removed by reactive ion etching (RIE).

Figure 6C:
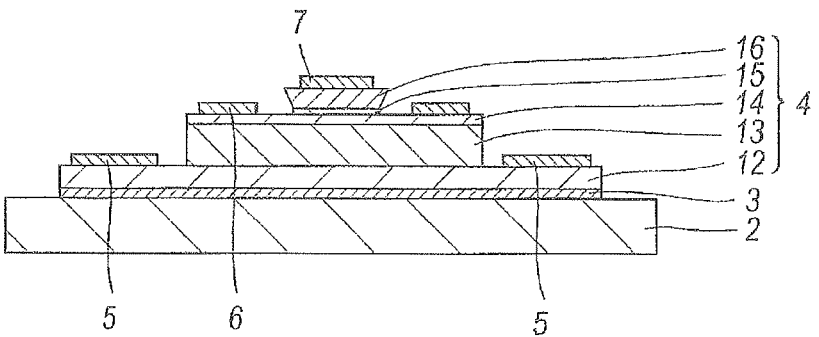

Next, as shown in FIG. 6C, the twelfth step removes the aforementioned etching mask 44 and then forms electrodes, 5 to 7, on a portion of the exposed sub-collector layer 12, on a portion of the exposed base layer 14, and on a portion of the exposed the emitter contact layer 16, respectively. Thus, the HBT 1 shown in FIG. 2 is completed.

Advantages of the HBT 1 produced by thus described process will be described. In the HBT 1, heat generated by current flow injected from the electrodes, 5 to 7, in the semiconductor stack 4 may be dissipated to the support 2 through the metal layer 3, which is constituted by the metal layers, 29 and 41, and comes in contact with the semiconductor stack 4 and the support 2. The metal layer 3 may include at least one of tungsten (W), molybdenum (Mo), and tantalum (Ta), where they have relatively large thermal conductivity, and have a thickness of 10 to 60 nm; accordingly, the heat generated in the semiconductor stack 4 may be efficiently dissipated to the support 2.

Moreover, the support 2 has a thermal conductivity greater than those of the semiconductor layers involved in the semiconductor stack 4. The support 2 may be attached after growing the semiconductor stack 23 on the semiconductor substrate 21, forming the temporary support 26 on the semiconductor stack 23, and replacing the semiconductor substrate 21 with the temporary support 26. Accordingly, the semiconductor stack 23 may secure the crystal quality thereof even if the support 2 that supports the semiconductor stack 23 is made of non-crystalline material. That is, the semiconductor stack 23 may be formed by a conventional technique that may maintain the crystal quality thereof.

The process to bond the temporary support 26 on the semiconductor stack 23, and the process to bond the metal layer 29 with the metal layer 41 on the support 2 may be carried out by the atomic diffusion bonding (ADB). Also, the metal layer 25 that covers the primary surface 23a of the semiconductor stack 23 may also cover the side surface thereof. Thus, the portion of the metal layer 25 may effectively cover the semiconductor stack 23 during the process.

Figure 8:
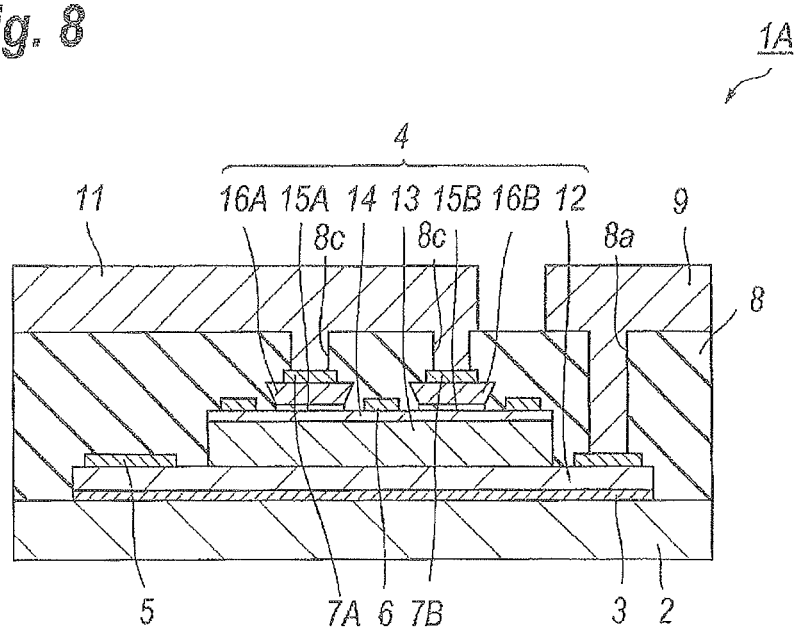
FIG. 8 shows a cross section of the semiconductor device shown in FIG. 7, where

FIG. 7 is a plan view of a semiconductor device modified from the first embodiment shown in FIG. 1, and FIG. 8 is a cross section taken along the line VIII-VIII indicated in FIG. 7. The semiconductor device 1A, which is also a type of the HBT, may provide two or more emitter layers, where FIGS. 7 and 8 illustrate two emitter layers, 15A and 15B, formed in respective areas isolated to each other on the base layer 14. The emitter layer 15A provides the emitter contact layer 16A, and the other emitter layer 15B provides another emitter contact layer 16B. The emitter contact layers, 16A and 16B, are connected to respective electrodes, 7A and 7B. Even such an HBT 1A shown in FIGS. 7 and 8, the metal layer 3 beneath the semiconductor stack 4 and the support 2 made of non-semiconductor material may effectively conduct heat generated in the semiconductor stack 4 to the support 2. Moreover, two or more emitter layers may increase the current flowing in the semiconductor stack 4, which enables the HBT 1A to be applied in high-power applications.

Second Embodiment

Next, another semiconductor device and a method to produce the other semiconductor device according to the second embodiment of the present application will be described. Description for elements same with those of the first embodiment will be omitted.

Figure 9:
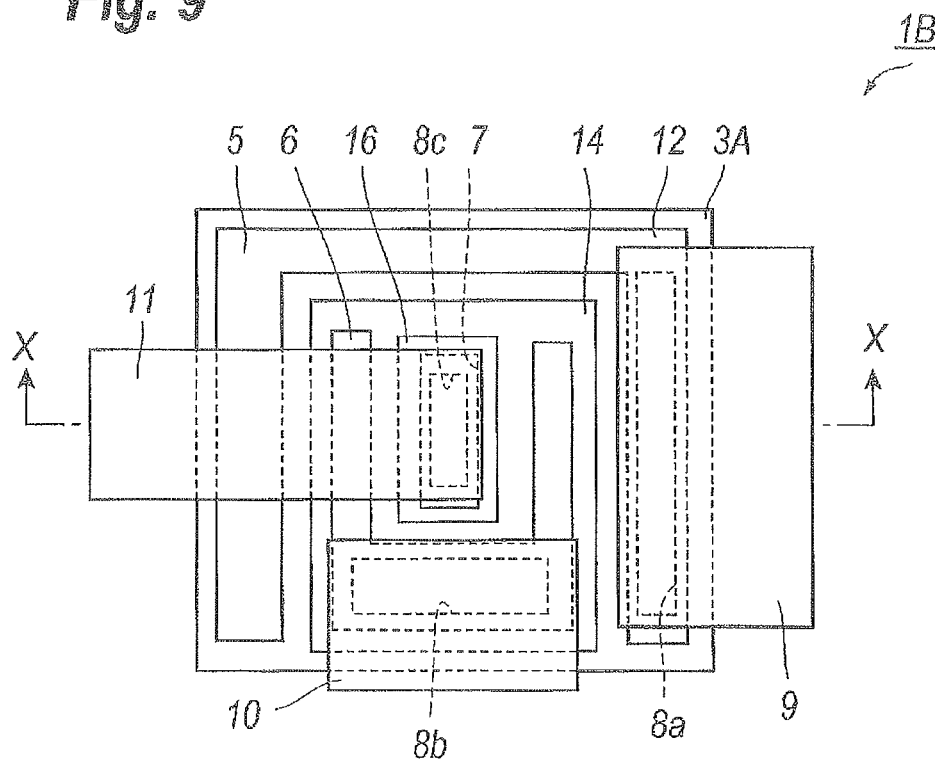
FIG. 9 is a plan view of a semiconductor device according to the second embodiment of the present application.
Figure 10:
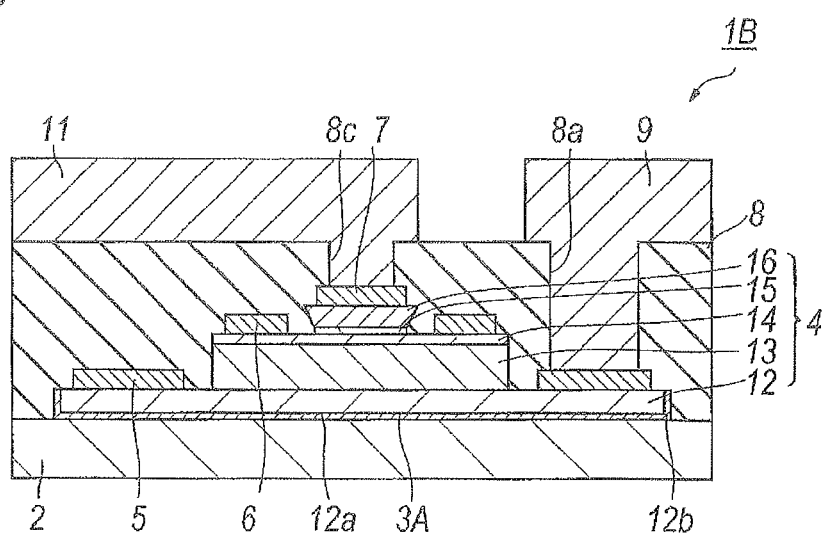
FIG. 10 shows a cross section of the semiconductor device shown in FIG. 9, where

FIG. 9 is a plan view of a semiconductor device 1B according to the second embodiment of the present application, and FIG. 10 shows a cross section of the semiconductor device 1B taken along the line X-X appearing in FIG. 9. As shown in FIGS. 9 and 10, the semiconductor device 1B provides a metal layer 3A between the support 2 and the semiconductor stack 4, where the metal layer 3A extends to at least a portion of the side surfaces of the semiconductor stack 4. Specifically, the metal layer 3A covers the sides 12b of the sub-collector layer 12 and the primary surface 12a thereof facing the support 2.

Figure 11A:
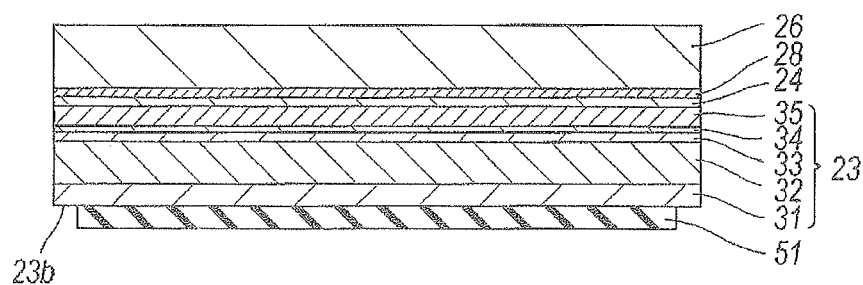
FIGS. 11A to 11C show cross sections of the whole temporary support at respective process steps subsequent to that shown in FIG. 3C.

Next, a process to produce the semiconductor device 1B will be described as referring to FIGS. 11 to 14 that show cross sections of a region, from which a semiconductor device 1B is going to be formed, at respective process steps. Referring to FIG. 11A, the process first forms an etching mask, namely, the etching mask 51 after removing the protection layer 22 from the semiconductor stack 23, which is the fourth step in the first embodiment, but before the deposition of the metal layer 29. The etching mask 51 covers a portion of the surface 23b of the semiconductor stack 23.

Figure 11B:
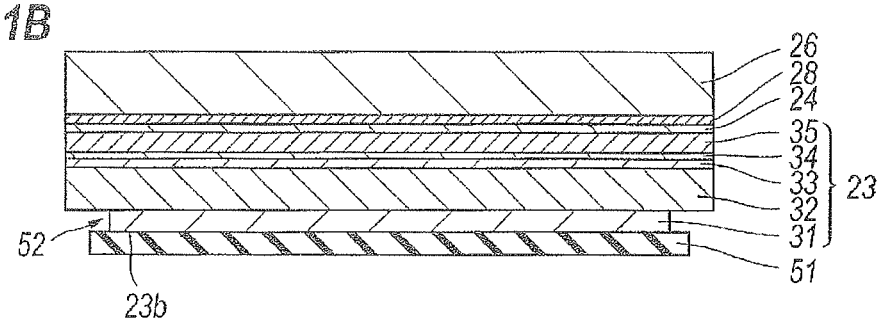
Figure 11C:
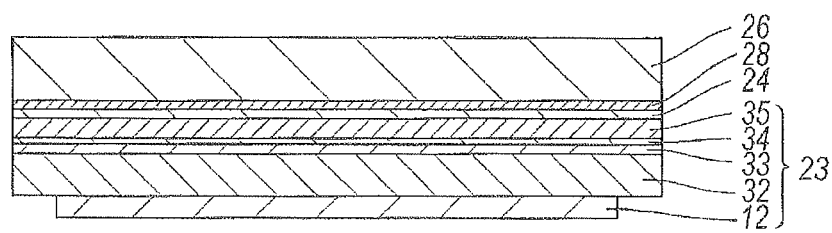

Next, the fifth step wet-etches a portion of the semiconductor stack 23 exposed from the etching mask 51 to form a step 52 in the surface 23b of the semiconductor stack 23, as shown in FIG. 11B. Because of the wet-etching, the lowermost semiconductor layer 31 is over-etched in a portion under peripheries of the etching mask 51 so as to form an overhang of the etching mask 51. The lowermost semiconductor layer 31 in the semiconductor stack 23 is converted to the sub-collector layer 12. The etching mask 51 is removed after the formation of the step 52, which is shown in FIG. 11C.

Figure 12A:
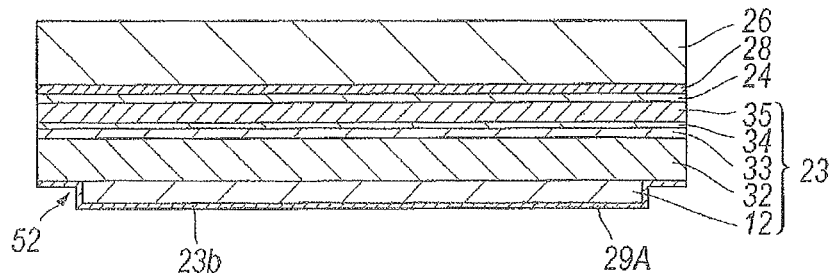
FIGS. 12A to 12C show cross sections of the part of the temporary support at respective process steps subsequent to that shown in FIG. 11C.

Next, the sixth step covers the step 52 with a metal layer 29A as shown in FIG. 12A. The metal layer 29A covers the surface and the sides of the sub-collector layer 12, and also a portion of the surface of the semiconductor layer 32, which is to be converted to the collector layer 13 and exposed from the sub-collector layer 12, in peripheries of the sub-collector layer 12.

Figure 12B:
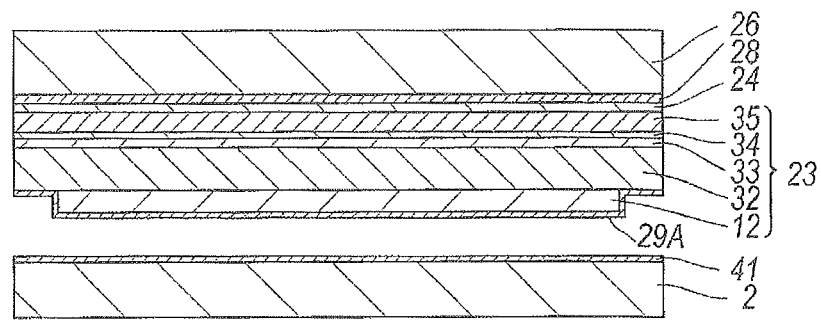
Figure 12C:
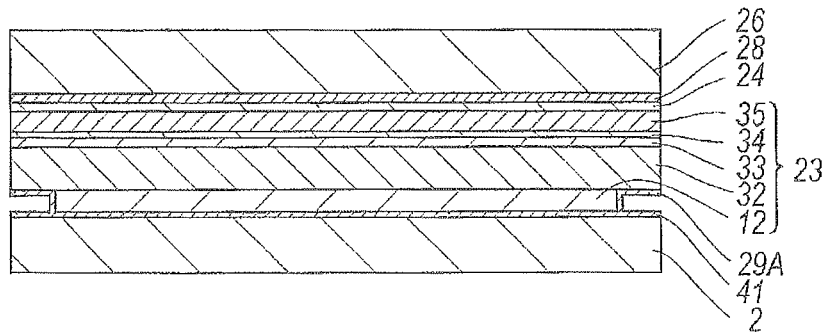

Next, the seventh step prepares the support 2 on which a metal layer 41 is formed, and the metal layer 29A is bonded to the metal layer 41 on the support 2 by the ADB, as shown in FIG. 12B. FIG. 12C illustrates the semiconductor stack 23 and the support 2 after bonding the metal layer 29A to the metal layer 41.

Figure 13A:
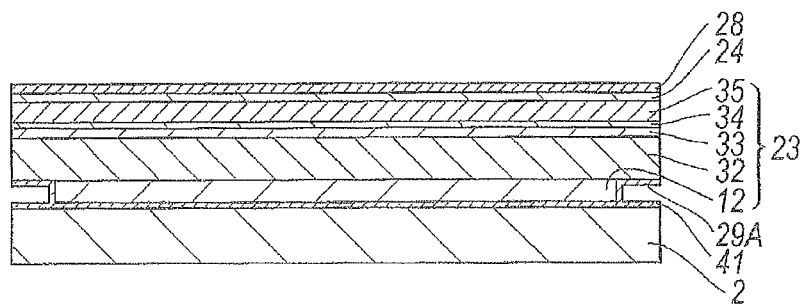
FIGS. 13A to 13C show cross sections of the semiconductor device at respective process steps subsequent to that shown in FIG. 12C.
Figure 13B:
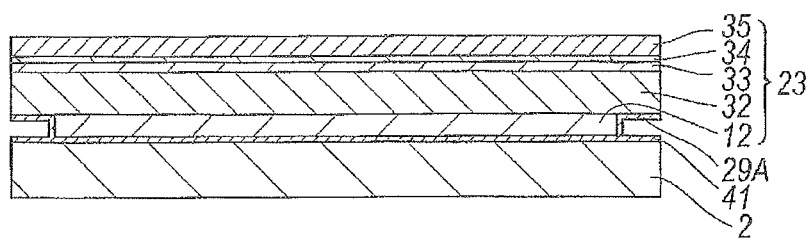

Next, the eighth step removes the temporary support 26 from the semiconductor stack 23, as shown in FIG. 13A, and then the metal layer 28 on the surface 23a of the semiconductor stack 23 and the protection layer 24 are sequentially removed, as shown in FIG. 13B.

Figure 13C:
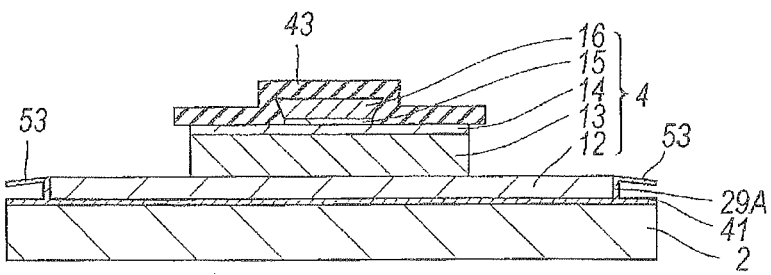

Next, similar to the eighth step in the first embodiment, the ninth step of the process etches portions of the semiconductor layers, 34 and 35, to form an emitter mesa including the emitter layer 15 and the emitter contact layer 16. Then, as shown in FIG. 13C, still another etching mask 43 covers the emitter contact layer 16 and the emitter layer 15, and portions of the semiconductor layers, 32 and 33, are sequentially etched to form a base mesa including the base layer 14. Thus, the semiconductor stack 4 including the sub-collector layer 12, the collector layer 13, the base layer 14, the emitter layer 15, and the emitter contact layer 16 is formed. A portion of the metal layer 29A formed on the surface of the semiconductor layer 32 is left as residual portions 53.

Figure 14A:
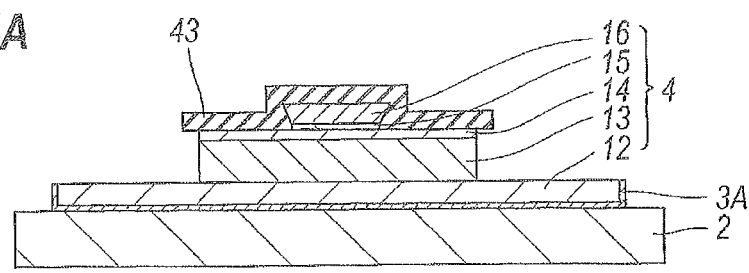
FIGS. 14A and 14B show cross sections of the semiconductor device at respective process steps subsequent to that shown in FIG. 13C.
Figure 14B:
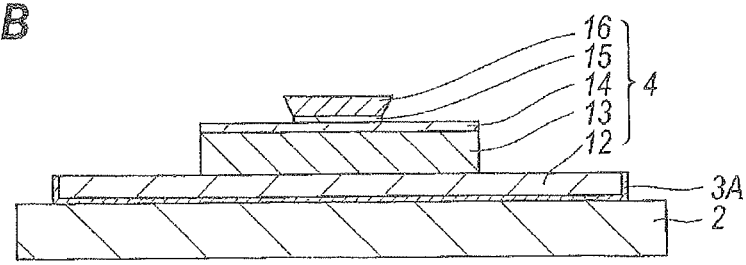

Next, as shown in FIG. 14A, the residual portions 53 of the metal layer 29A and a portion of the metal layer 41 exposed on the support 2 in peripheries of the sub-collector layer 12 are removed by, for instance, reactive ion etching (RIE). Removal of the residual portions 53 may relax the electric field concentrating on the semiconductor stack 4 and prevent the short-circuit failure caused by the left metal flakes. Thus, the metal layer 3A may cover the primary surface of the support 2 and the sides of the sub-collector layer 12. After removal of the residual metals 53, the process removes the etching mask 43 as shown in FIG. 14B, and then, the electrodes of the emitter 8, the collector 5, and the base 6 are formed by processes similar to those of the first embodiment. Thus, the semiconductor device 1B according to the second embodiment of the present application is completed.

The semiconductor device 1B of the second embodiment may have advantages same with those of the first embodiment. Also, the heat generated in the semiconductor stack 4 may be efficiently dissipated externally not only through the primary surface 12a of the sub-collector layer 12 facing the support 2 but the sides 12b of the sub-collector layer 12 to the support 2. Accordingly, the semiconductor device 1B may show further efficient heat dissipating performance.

Third Embodiment

Next, a process to produce the semiconductor device according to the third embodiment will be described as referring to FIGS. 15 to 17, where those figures show cross sections of a whole semiconductor substrate, or a whole substrate at respective process steps.

Figure 15A:
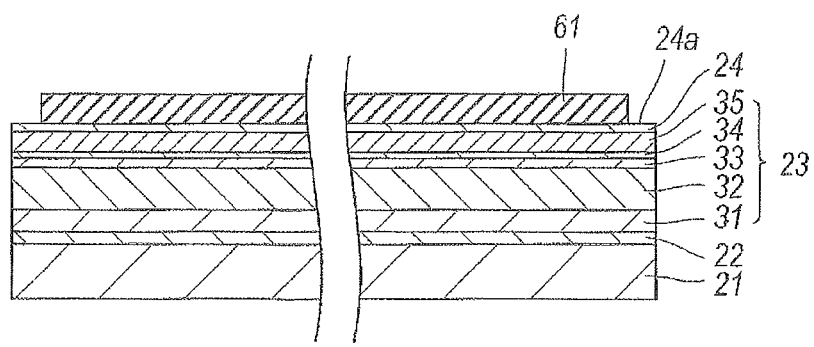
FIGS. 15A to 15C show cross sections of the whole semiconductor substrate at respective process steps according to the third embodiment.

Referring to FIG. 15A, the process first prepares a semiconductor substrate 21 that stacks the protection layer 22, the semiconductor stack 23, and the other protection layer 24 thereon in this order. Then, an etching mask 61 covers a portion of the other protection layer 24. The etching mask 61 exposes peripheries 24a of the semiconductor layers grown in peripheries of the semiconductor substrate 21 because the peripheries of the semiconductor wafer (substrate) and semiconductor layers grown thereon generally degrade the crystal quality thereof, and contaminations are left thereon. The ADB to be carried in a subsequent step requires clean surfaces on substances to be bonded; accordingly, it is preferable that the peripheries of the semiconductor layers be removed. The etching mask 61 may be made of inorganic material, or organic material including resin.

Figure 15B:
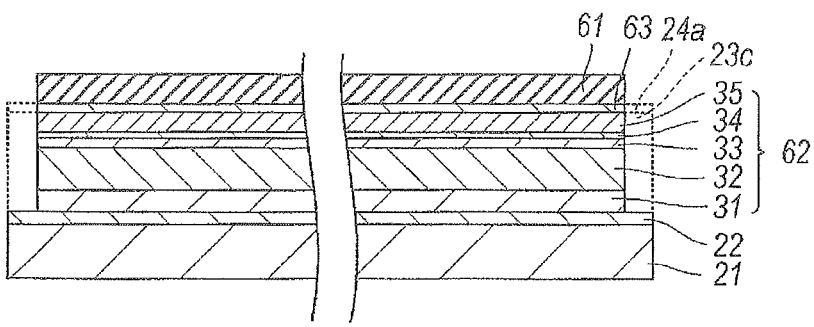

The process next removes the protection layer 24 and the semiconductor stack 23 in the region exposed from the mask 61, as shown in FIG. 15B. That is, the protection layer 24 in the peripheries 24a thereof and the semiconductor stack 23 also in the peripheries 23c of the semiconductor substrate 21 are sequentially removed to form a semiconductor stack 62 and the protection layer 63. The wet-etching and/or the dry-etching may remove the peripheries 24a of the protection layer 24 and those 23c of the semiconductor stack 23.

Figure 15C:
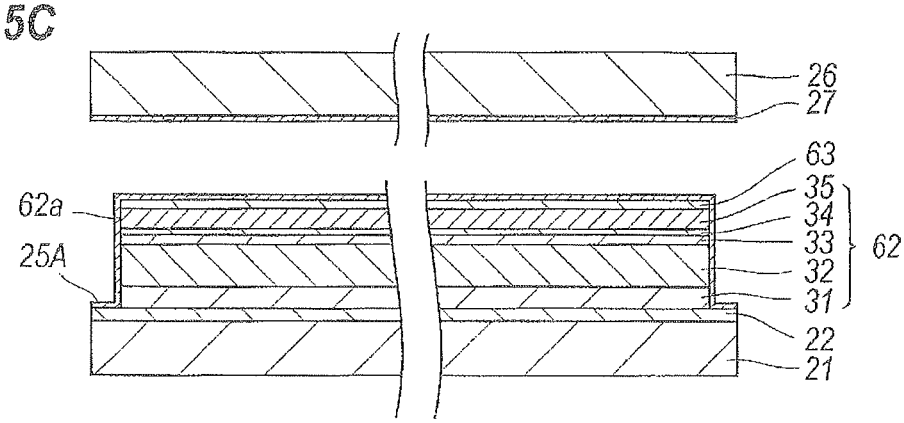

Next, the process deposits a metal layer 25A on the exposed protection layer 22, on the protection layer 63, and the sides 62a of the semiconductor stack 62. Also, a temporary support 26 with the metal layer 27 on the surface thereof is prepared, as shown in FIG. 15C.

Figure 16A:
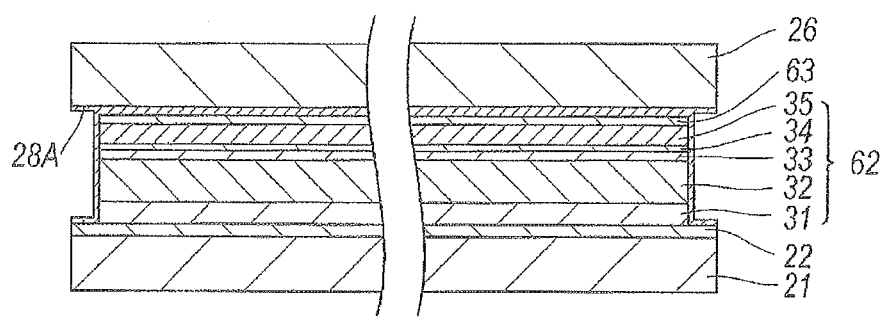
FIGS. 16A to 16C show cross sections of the whole temporary support at respective process steps subsequent to that shown in FIG. 15C.

Referring to FIG. 16A, similar to the second step of the first embodiment, the metal layer 25A on the protection layer 63 is bonded to the metal layer 27 on the temporary support 26 to form a composite metal layer 28A as shown in FIG. 16A. Thus, the semiconductor stack 62 is bonded with the temporary support 26.

Figure 16B:
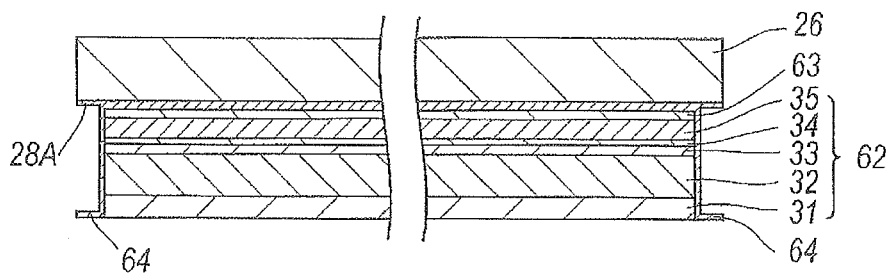

Next, similar to the third and fourth steps of the first embodiment, the process sequentially removes the semiconductor substrate 21 and the protection layer 22. The semiconductor substrate 21 may be selectively removed with respect to the protection layer 22, while, the protection layer 22 may be selectively removed with respect to the lowermost semiconductor layer 31 in the semiconductor stack 62. A portion of the composite metal layer 28A in contact with the protection layer 22 is left as residual portions 64, as shown in FIG. 16B.

Figure 16C:
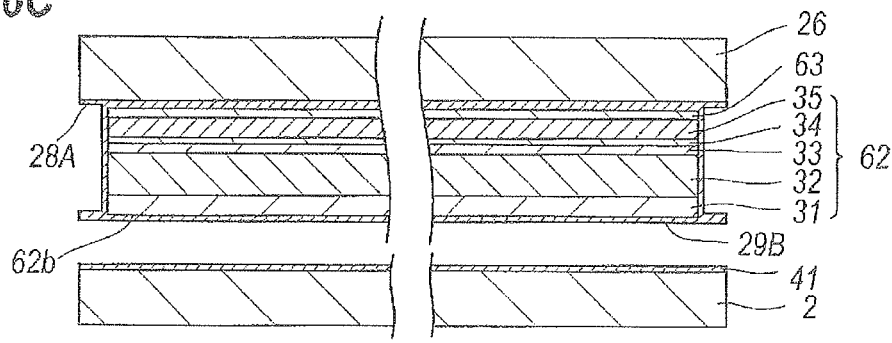

Referring to FIG. 16C, the process next prepares the support 2 with a metal layer 41 thereon, and covers the exposed lowermost semiconductor layer 31 in the semiconductor stack 62, namely, the bottom surface 62b of the semiconductor stack 62, with a metal layer 29B. The metal layer 29B may also cover the residual portion of the metal layer 64 and cover the sides of the semiconductor stack 62.

Figure 17A:
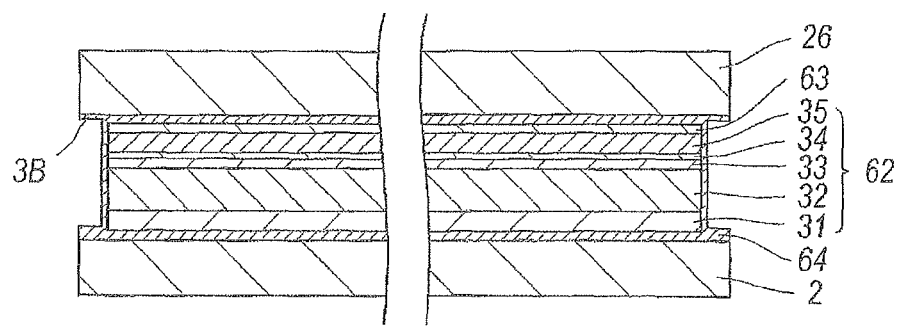
FIGS. 17A to 17C show a cross section of the whole support at respective process steps subsequent to that shown in FIG. 16C.
Figure 17B:
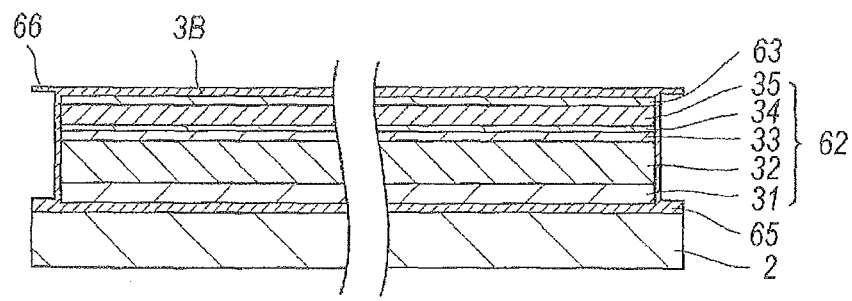
Figure 17C:
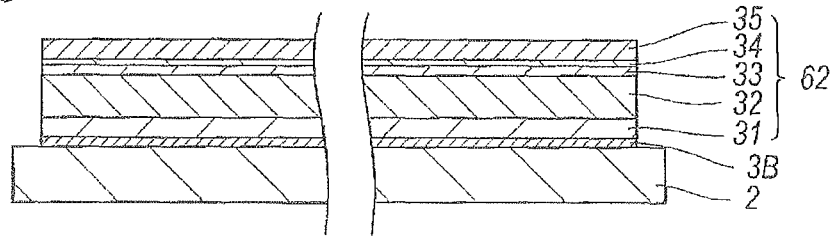

Then, similar to the fifth step of the first embodiment, the metal layer 29B covering the bottom surface 62b of the semiconductor stack 62 is bonded to the metal layer 41 on the support 2, as shown in FIG. 17A. The ADB may carry the bonding of two metal layers, 29B and 41.

Then, similar to the sixth step of the first embodiment shown in FIG. 4C, the process removes the temporary support 26 from the semiconductor stack 62 by the dry-etching and/or wet-etching. The removal of the temporary support 26 leaves the metal residual 66 in peripheries of the semiconductor stack 62, which protrudes outward from the semiconductor stack 62. Thus, the process leaves two metal residuals, 65 and 66, on the support 2 and extending from the protection layer 63, respectively.

Then, similar to the seventh step of the first embodiment shown in FIG. 5A, the process removes the residual portions, 65 and 66, of the metal layer 64 and the portion on the top of the protection layer 63 to leave the metal layer 3B only between the support 2 and the lowermost semiconductor layer 31 in the semiconductor stack 62. Finally, the process removes the protection layer 63 on the semiconductor stack 62. Subsequently, the process steps similar to the first and second embodiments to form respective mesas in the semiconductor stack 62 may complete the semiconductor device of the type of the HBT.

The process according to the third embodiment thus described may show advantages similar to or same with those obtained by the first embodiment. In Addition, the third embodiment covers the sides 62a of the semiconductor stack 62 by the metal layer 28A, which may support the semiconductor stack 62 when the semiconductor substrate 21 is removed from the semiconductor stack 62. Similarly, the metal layer 28A in the sides of the semiconductor stack 62 may cover the semiconductor stack 62 when the temporary substrate 26 is removed therefrom.

The process of producing the semiconductor devices, 1 to 1B, are not restricted to those above described embodiment and the modifications therefrom, and may be variously further modified. For instance, the emitter layer 15 of the semiconductor device 1B of the second embodiment, like those of the modified first embodiment, may be divided into several portions each formed in respective regions independent to each other on the base layer 14. The description above concentrates on the semiconductor device type of, what is called, the hetero-bipolar transistor (HBT). However, the process according to the present application may be applicable to another type of the semiconductor device often called as a HEMT (High-Electron Mobility Transistor).

Moreover, the bonding of the metal layer 25 to another metal layer 27 is not restricted to the ADB. The bonding using BCB (Benzo-Cychro-Butane) is applicable to the present invention. Also, the semiconductor stack 23 may include an etch-stopper layer. In an example, the etch-stopper layer, which is put between the semiconductor layers, 32 and 33, in the semiconductor stack 23, has an etching rate far smaller than that of the semiconductor layer 33. Such an etch-stopper layer may protect the semiconductor layer 32 from being etched.

Also, the process according to the third embodiment leaves the metal residuals 53, and 64 to 66. However, these metal residuals are not always left in the process. Also, the process of the third embodiment removes the semiconductor stack 62 in the peripheries of the semiconductor substrate 21. However, the process may not grow semiconductor layers, 22, 31 to 35, and 63, in the peripheries of the semiconductor substrate 21.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure and are intended to be covered by the following claims.

I claim:

1. A method of producing a semiconductor device, comprising steps of:
   growing a plurality of semiconductor layers to form a semiconductor stack on a semiconductor substrate;
   forming a first adhesive layer on the semiconductor stack;
   bonding a temporary support made of non-semiconductor material to the first adhesive layer;
   removing the semiconductor substrate from the semiconductor stack to expose a surface of the semiconductor stack;
   forming a second adhesive layer on the exposed surface of the semiconductor stack;
   bonding a support to the second adhesive layer; and
   removing the temporary support from the semiconductor stack,
   wherein the support bonded to the second adhesive layer has a thermal conductivity greater than thermal conductivities of the semiconductor layers forming the semiconductor stack, and
   wherein the step of forming the first adhesive layer includes a step of covering a whole side surface of the semiconductor stack by a metal layer made of at least one of tungsten (W), molybdenum (Mo), and tantalum (Ta).

2. The method of claim 1,
   wherein the step of bonding the temporary support to the first adhesive layer is carried out continuously with the step of forming the first adhesive layer without exposing the first adhesive layer to an atmosphere.

3. The method of claim 2,
   wherein the step of bonding the support to the second adhesive layer is carried out continuously with the step of forming the second adhesive layer without exposing the second adhesive layer to an atmosphere.

4. The method of claim 1,
wherein at least one of the step of forming the first adhesive layer and the step of forming the second adhesive layer includes a step of forming a metal layer made of at least one of tungsten (W), molybdenum (Mo), and tantalum (Ta) by sputtering.

5. The method of claim 1, further including a step of etching a portion of a lowermost semiconductor layer in the semiconductor stack to form a step in the semiconductor stack after the step of removing the semiconductor substrate but before the step of forming the second adhesive layer, and
wherein the step of forming the second adhesive layer includes a step of covering the step in the semiconductor stack by the second adhesive layer.

6. The method of claim 1, further including a step of removing a periphery of the semiconductor stack before the step of forming the first adhesive layer,
wherein the step of forming the first adhesive layer includes a step of forming the first adhesive layer so as to cover a top of the semiconductor stack and a side of the semiconductor stack that is exposed by the step of removing the periphery of the semiconductor stack.

7. The method of claim 6,
further including a step of, after the step of removing the temporary support, removing the first adhesive layer covering the top and the side of the semiconductor stack.

8. The method of claim 7, further including a steps of, after the step of removing the first adhesive layer,
sequentially etching a portion of the semiconductor stack to form an emitter mesa, a portion of the semiconductor stack to form a base mesa, and a portion of the semiconductor stack to form a collector mesa, and
forming electrodes on the semiconductor stack.

9. The method of claim 1,
wherein the step of bonding the support to the second adhesive layer is carried out continuously with the step of forming the second adhesive layer without exposing the second adhesive layer to an atmosphere.

10. A method of producing a semiconductor device, comprising steps of:
growing a plurality of semiconductor layers to form a semiconductor stack on a semiconductor substrate;
removing a periphery of the semiconductor stack;
forming a first adhesive layer on the semiconductor stack after removing the periphery of the semiconductor stack;
bonding a temporary support made of non-semiconductor material to the first adhesive layer;
removing the semiconductor substrate from the semiconductor stack to expose a surface of the semiconductor stack;
forming a second adhesive layer on the exposed surface of the semiconductor stack;
bonding a support to the second adhesive layer; and
removing the temporary support from the semiconductor stack,
wherein the support bonded to the second adhesive layer has a thermal conductivity greater than thermal conductivities of the semiconductor layers forming the semiconductor stack, and
wherein the step of forming the first adhesive layer includes a step of forming the first adhesive layer so as to cover a top of the semiconductor stack and a side of the semiconductor stack that is exposed by the step of removing the periphery of the semiconductor stack.

11. The method of claim 10,
wherein the step of bonding the temporary support to the first adhesive layer is carried out continuously with the step of forming the first adhesive layer without exposing the first adhesive layer to an atmosphere.

12. The method of claim 11,
wherein the step of bonding the support to the second adhesive layer is carried out continuously with the step of forming the second adhesive layer without exposing the second adhesive layer to an atmosphere.

13. The method of claim 10,
wherein the step of bonding the support to the second adhesive layer is carried out continuously with the step of forming the second adhesive layer without exposing the second adhesive layer to an atmosphere.

14. The method of claim 10,
wherein at least one of the step of forming the first adhesive layer and the step of forming the second adhesive layer includes a step of forming a metal layer made of a least one of tungsten (W), molybdenum (Mo), and tantalum (Ta) by sputtering.

15. The method of claim 10, further including a step of etching a portion of a lowermost semiconductor layer in the semiconductor stack to from a step in the semiconductor stack after the step of removing the semiconductor substrate but before the step of forming the second adhesive layer, and
wherein the step of forming the second adhesive layer includes a step of covering the step in the semiconductor stack by the second adhesive layer.

16. The method of claim 10, further including a step of, after the step of removing the temporary support, removing the first adhesive layer covering the top and the side of the semiconductor stack.

17. The method of claim 10, further including steps of, after the step of removing the first adhesive layer,
sequentially etching a portion of the semiconductor stack to form an emitter mesa, a portion of the semiconductor stack to form a base mesa, and a portion of the semiconductor stack to form a collector mesa, and
forming electrodes on the semiconductor stack.

18. A method of producing a semiconductor device, comprising steps of:
growing a plurality of semiconductor layers to form a semiconductor stack on a semiconductor substrate;
forming a protective layer on the semiconductor stack;
forming a first adhesive layer on the protective layer;
bonding a temporary support made of non-semiconductor material to the first adhesive layer;
removing the semiconductor substrate from the semiconductor stack to expose a surface of the semiconductor stack;
forming a second adhesive layer on the exposed surface of the semiconductor stack;
bonding a support to the second adhesive layer;
removing the temporary support from the semiconductor stack; and
removing the protective layer,
wherein the support bonded to the second adhesive layer has a thermal conductivity greater than thermal conductivities of the semiconductor layers forming the semiconductor stack.

19. The method of claim 18, wherein at least one of the step of forming the first adhesive layer includes a step of covering a whole side surface of the semiconductor stack by a metal layer made of a least one of tungsten (W), molybdenum (Mo), and tantalum (Ta) by sputtering.

20. The method of claim 18, further including a step of removing a periphery of the semiconductor stack before the step of forming the first adhesive layer,
   wherein the step of forming the first adhesive layer includes a step of forming the first adhesive layer so as to cover a top of the semiconductor stack and a side of the semiconductor stack that is exposed by the step of removing the periphery of the semiconductor stack.

* * * * *